United States Patent
Kuno et al.

Patent Number: 6,162,729
Date of Patent: Dec. 19, 2000

[54] METHOD OF MANUFACTURING MULTIPLE ALUMINUM LAYER IN A SEMICONDUCTOR DEVICE

[75] Inventors: Toyohiko Kuno, Miyazaki; Kenichi Kitamura, Shizuoka; Ken Tanaka, Miyazaki, all of Japan

[73] Assignee: Asahi Kasei Kogyo Kabushiki Kaisha, Osaka, Japan

[21] Appl. No.: 09/319,775

[22] PCT Filed: Dec. 12, 1997

[86] PCT No.: PCT/JP97/04590

§ 371 Date: Jun. 11, 1999

§ 102(e) Date: Jun. 11, 1999

[87] PCT Pub. No.: WO98/26450

PCT Pub. Date: Jun. 18, 1998

[30] Foreign Application Priority Data

Dec. 12, 1996 [JP] Japan ................................ 8-331931

[51] Int. Cl.[7] ................................................ H01L 21/44
[52] U.S. Cl. ................................................ 438/688; 438/643
[58] Field of Search ................................ 438/688, 675, 438/672, 643, 629

[56] References Cited

U.S. PATENT DOCUMENTS

| | | |
|---|---|---|
| 4,970,176 | 11/1990 | Tracy et al. . |
| 5,055,908 | 10/1991 | Fuller et al. . |
| 5,270,255 | 12/1993 | Wong .......................... 438/688 |
| 5,300,813 | 4/1994 | Joshi et al. . |
| 5,356,836 | 10/1994 | Chen et al. . |
| 5,470,792 | 11/1995 | Yamada . |
| 5,523,259 | 6/1996 | Merchant et al. ............ 438/688 |
| 5,633,199 | 5/1997 | Fiordalice et al. ........... 438/642 |
| 5,658,828 | 8/1997 | Lin et al. ..................... 438/643 |
| 5,798,300 | 8/1998 | Chittipeddi et al. ......... 438/627 |
| 5,963,835 | 10/1999 | Sandhu et al. ............... 438/681 |

FOREIGN PATENT DOCUMENTS 4-64222  2/1992  Japan .

*Primary Examiner*—Charles Bowers
*Assistant Examiner*—Thanh Nguyen
*Attorney, Agent, or Firm*—Finnegan, Henderson, Farabow, Garrett & Dunner, LLP

[57] ABSTRACT

A method of forming a wiring of an aluminum material having a low-temperature sputtering process for sputtering an aluminum material (aluminum or an alloy composed mainly of aluminum) at a temperature of below 300° C. and a high-temperature sputtering process for sputtering at or above 300° C., a film thickness (A) obtained by the low-temperature sputtering process is larger than a film thickness (B) obtained by the high-temperature sputtering process, and a deposition rate at high temperature sputtering is a rate which does not deteriorate the shape of a registration accuracy measurement mark, preferably 200 nm/min or less.

13 Claims, 2 Drawing Sheets

METHOD OF MANUFACTURING MULTIPLE ALUMINUM LAYER IN A SEMICONDUCTOR DEVICE

FIELD OF THE INVENTION

The present invention relates to a production method of a semiconductor device, more specifically to a formation method of a wiring of aluminum or an alloy mainly comprising aluminum (hereinafter referred to as an "aluminum material").

BACKGROUND TECHNOLOGY

In general, as a formation method of wiring of a semiconductor device, a sputtering (low-temperature sputtering) method for depositing an aluminum material at a temperature of below 300° C. is used. Recently, with the spread of microstructures of semiconductor devices, there may occur an accident of open-circuit due to insufficient filling of aluminum material in a wiring connection hole.

As means for solving such a problem, a reflow method in which an aluminum material is deposited by sputtering while keeping a semiconductor device at about room temperature and then heated to above 500° C., and a high-temperature sputtering in which an aluminum material is deposited by sputtering while keeping a semiconductor device at above 400° C. are known to be capable of filling an aluminum material in a fine wiring connection hole or a wiring groove The prior art reflow method and high-temperature sputtering method have respective problems. First, in the reflow method, after an aluminum material required for filling a wiring connection hole or a wiring groove is deposited at a temperature of below 100° C., in the state where the deposition is of discontinued, heated to a temperature of above 500° C. in the state of staying on the semiconductor device to remelt the aluminum material deposited on the semiconductor device, thereby moving the aluminum material to fill in the wiring connection hole or the wiring groove. However, when a wiring comprising an aluminum material is buried in the underlayer, this method has a danger of causing plastic deformation of the buried wiring by heating to above 500° C., resulting in a malfunction.

In the high-temperature sputtering method, on the other hand, after a low-temperature sputtering aluminum layer is previously formed by depositing an aluminum material by sputtering (low-temperature sputtering) at a temperature of below 100° C., followed by sputtering deposition of an aluminum material at a temperature of above 400° C. (high-temperature sputtering), thereby filling the wiring connection hole or the wiring groove. However, in order to fill in the wiring connection hole when performing sputtering (high-temperature sputtering) at above 400° C., a film thickness (B) of high-temperature sputtering has been larger than a film thickness (A) of low-temperature sputtering.

However, under the above conditions, there may be a case that the shape of a registration accuracy measurement mark is destructed by heat treatment at high-temperature sputtering.

The registration accuracy measurement mark is a mark (shape) for measuring a registration accuracy of pattern used in each photolithography process, and when the wiring connection hole (or the wiring groove) is filled when forming a wiring with an aluminum material, the aluminum material is also deposited on the registration accuracy measurement mark as well. At this moment, since the shape is destructed by heat treatment in the above case, there may occur a problem in that the registration accuracy cannot be known exactly.

In the case of A>B, on the contrary, heat treatment at high-temperature sputtering is insufficient, filling of fine wiring connection hole is imperfect, and a gap tends to be generated, which is a problem in reliability.

Further, even when the depth of the connection hole is shallowed by providing a plug, in a stacked structure or the like where two connection holes are piled up, there is a problem in that a hollow tends to generate. If a high-temperature condition is used or high-temperature sputtering is performed to prevent generation of such a hollow, the shape of the registration accuracy measurement mark is destructed as in the above-described case, and the registration accuracy cannot be known exactly.

DISCLOSURE OF THE INVENTION

It is therefore an object of the present invention to provide a production method of a semiconductor device related to high-temperature sputtering capable of filling an aluminum material in a fine wiring connection hole or a wiring groove without destructing the shape of a registration accuracy measurement mark.

The inventors have found an optimum condition of high-temperature sputtering for solving the above-described problems and accomplished the present invention.

Specifically, in accordance with the present invention, there is provided a production method of a semiconductor device for filling in a wiring connection hole by sputtering deposition of aluminum or an alloy mainly comprising aluminum (aluminum material) characterized by a process for first depositing aluminum or an alloy mainly comprising aluminum at a temperature of below 300° C. followed by a process for depositing aluminum or an alloy mainly comprising aluminum at or above 300° C., wherein a thickness A of the film of aluminum or an alloy mainly comprising aluminum deposited at a temperature of below 300° C. and a thickness B of the film of aluminum or an alloy mainly comprising aluminum deposited at or above 300° C. are in a relation of A>B, and a deposition rate of aluminum or an alloy mainly comprising aluminum deposited at or above 300° C. is a rate which does not deteriorate the shape of a registration position measurement mark, preferably at or less than 200 nm/min.

Here, it is preferable that the deposition rate of aluminum or an alloy mainly comprising aluminum deposited at or above 300° C. is 200 nm/min or less.

It is more preferable that the deposition rate is 40 nm/min to 100 nm/min.

The low-temperature sputtering may also be carried out at room temperature to 100° C.

The high-temperature sputtering may also be carried out at a temperature of 300° C. to 500° C.

The high-temperature sputtering may also be carried out at a temperature of 350° C. to 400° C.

The aluminum material may also be aluminum.

The aluminum material may also be an aluminum alloy.

The aluminum alloy may also be aluminum—1.0 weight % silicon—0.5 weight % copper.

The aluminum material layer may be formed after forming an underlayer.

The underlayer may be selected from the group consisting of titanium film, titanium nitride film, titanium-tungsten alloy film, and tungsten nitride film.

The underlayer may comprise a laminate of titanium film, titanium nitride film and titanium film.

Part of the wiring connection hole may be buried with tungsten.

BEST MODE FOR PRACTICING THE INVENTION

Figure 1:
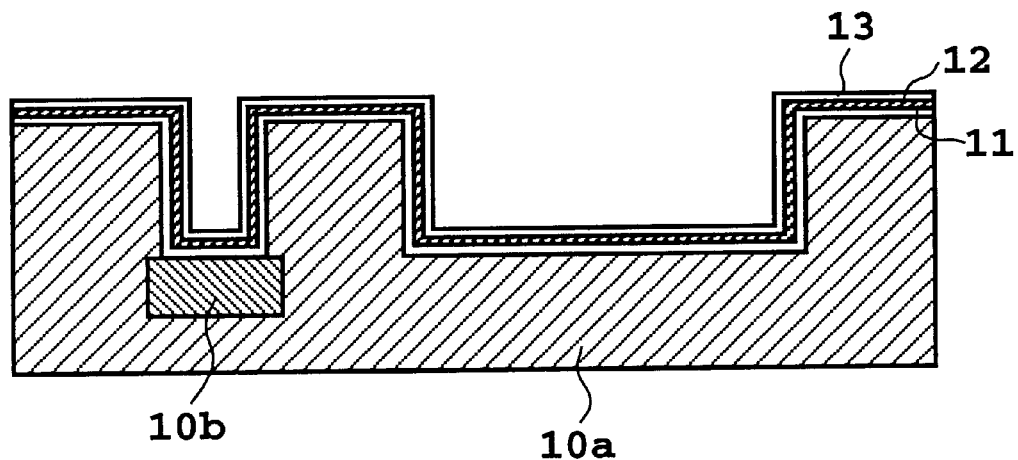
FIG. 1 is a sectional diagram showing a semiconductor device before forming aluminum material according to the production method of the present invention.

In the following, the production method of a semiconductor device according to the present invention will be described in detail.

The present invention comprises a process (low-temperature sputtering) for depositing aluminum material (aluminum or an alloy mainly comprising aluminum) at a temperature of below 300° C., followed by a process (high-temperature sputtering) for depositing the aluminum material at or above 300° C., in which the low-temperature sputtering is carried out at room temperature to less than 300° C., specifically, it is preferable to carry out the low-temperature sputtering at a temperature in a range from room temperature to 100° C. The high-temperature sputtering is carried out at a temperature of 300° C. to 500° C., specifically, it is preferable to be carried out at a temperature in a range from 350° C. to 400° C.

For both the low-temperature sputtering and the high-temperature sputtering, a conventional DC sputtering or the like known in the art can be used, however, are not limited to a specific sputtering method. Further, the underlayer may be previously formed before sputtering the aluminum material.

As the underlayer, titanium (Ti), titanium nitride (TiN), titanium-tungsten alloy (TiW), tungsten nitride (WN) or the like can be used.

As an aluminum alloy used as the aluminum material, an aluminum alloy generally used in wiring can be employed, and not limited to a specific material. Such an alloy includes, for example, an ordinary aluminum-silicon-copper alloy, in which the silicon is substituted with germanium or tin (Al—Ge—Cu, Al—Sn—Cu), or an alloy with silicon removed (Al—Cu).

The relation of A>B between the film thickness A obtained by low-temperature sputtering and the film thickness B obtained by high-temperature sputtering in the present invention means that when the low-temperature sputtering and the high-temperature sputtering are equal in the deposition rate, a low-temperature sputtering time is longer than a high-temperature sputtering time, and an effect of heat treatment of the high-temperature sputtering can be decreased. That is, the shape of the registration accuracy measurement mark is not deteriorated at high-temperature sputtering.

However, under the condition of A>B, there may be a case that the wiring connection hole is not filled completely due to insufficient heat treatment in the high-temperature sputtering, resulting in generation of a gap.

Then, in addition to the condition of A>B, the deposition rate is reduced from the prior art high deposition rate for increased productivity to a deposition rate which does not deteriorate the shape of the registration position measurement mark, whereby achieving complete filling of the wiring connection hole which is the object of the present invention, and shape maintenance of the registration accuracy measurement mark.

Specifically, by decreasing the deposition rate at the high-temperature sputtering to a deposition rate which does not deteriorate the shape of the registration position measurement mark, preferably to 200 nm/min or less, the aluminum material as the sputtered material is gradually deposited, and the wiring connection hole is gradually filled without generation of a gap, thus obtaining perfect filling. Further, a flat deposition film is obtained without generation of a hollow. It is specifically preferable that the deposition rate is in a range from 40 nm/min to 100 nm/min.

EMBODIMENTS

The present invention will be described in further detail with reference to the embodiments.

Embodiment 1

A production method of a semiconductor device according to the present embodiment is illustrated in FIG. 1. On a semiconductor device including a dielectric film 10a having a wiring connection hole and a registration accuracy measurement mark and a wiring 10b mainly comprising aluminum—1.0 weight % silicon—0.5 weight % copper which is buried, an underlayer is first formed. Specifically, in the state kept at 50° C., a 30 nm thick titanium film 11 is deposited by DC sputtering, followed by deposition of a 50 nm thick titanium nitride film 12 by a reactive DC sputtering using nitrogen and argon, and further deposition of a 30 nm thick titanium film 13 by DC sputtering. The above state is used as a standard sample (FIG. 1) before forming the aluminum material.

On the standard sample, a 30 nm thick titanium film 13 is first formed as an additional underlayer by DC sputtering in the state maintained at 50° C.

Next, as the low-temperature sputtering, a 260 nm thick aluminum alloy film 14 comprising aluminum—1.0 weight % silicon—0.5 weight % copper is deposited by DC sputtering. As to the deposition conditions at this moment, argon is used as a process gas, the process gas is controlled at a pressure of 3 mTorr, the deposition temperature at 100° C., and the deposition rate at 1 μm/min.

Figure 2:
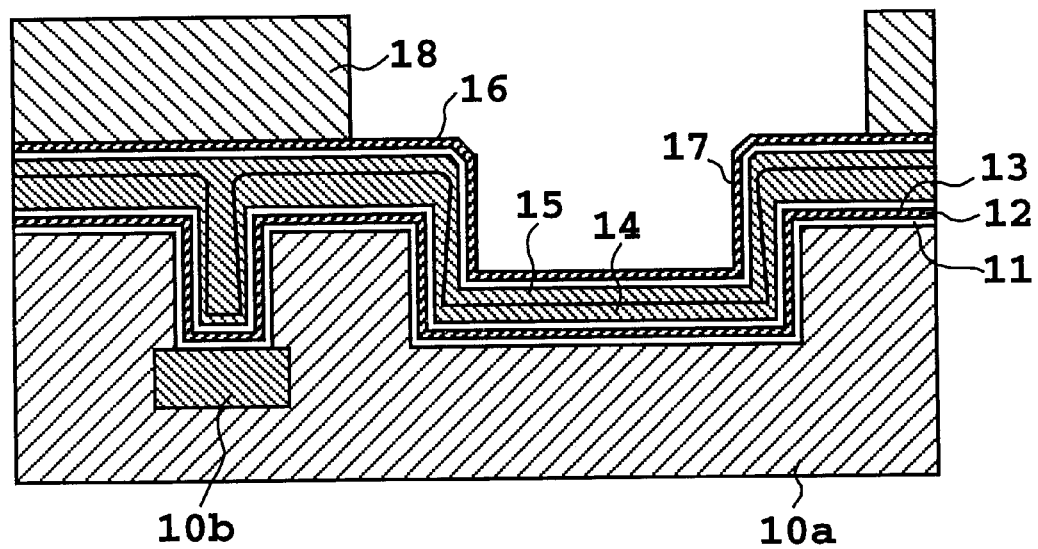
FIG. 2 is a sectional diagram showing a sectional structure of a wiring connection hole and a registration accuracy measurement mark of a semiconductor device on which aluminum material is formed according to the production method of the present invention.

Next, as the high-temperature sputtering, a 240 nm thick aluminum alloy film 15 comprising aluminum—1.0 weight % silicon—0.5 weight % copper is deposited by DC sputtering. As to the deposition conditions at this moment, argon is used as a process gas, the process gas is controlled at a pressure of 3 mTorr, the deposition temperature at 400° C., and the deposition rate at 75 nm/min Finally, a 30 nm thick titanium film 16 is deposited by DC sputtering on the semiconductor device maintained at 50° C., followed by deposition of a 30 nm thick titanium nitride film 17 by reactive DC sputtering using nitrogen and argon, thereby obtaining a semiconductor device (FIG. 2) having a desired buried wiring connection hole.

A method for evaluating the semiconductor device having the buried wiring connection hole will be described. The semiconductor device is coated with a positive type resist 18, exposure and development are carried out according to conventional methods known in the art to form a wiring resist pattern. A relative two-dimensional coordinate accuracy between a registration accuracy measurement mark present in the resist pattern and the registration accuracy measurement mark already formed on the semiconductor device was optically measured. As a result, registration error in an optional xy direction was ±0.18 µm. Further, the wiring connection hole of the semiconductor device was observed by means of an optical excitation current measurement (OBIC) method and confirmed that no gap was present in the wiring connection hole. Therefore, the wiring connection hole is completely filled and is in the reliable state with sufficiently reduced registration error.

Embodiment 2

Another embodiment will be shown. As in Embodiment 1, on the standard sample (FIG. 1), a 30 nm thick titanium film 13 is first deposited as an additional underlayer by DC sputtering in the state maintained at 50° C.

Next, as the low-temperature sputtering, a 400 nm thick aluminum alloy film 14 comprising aluminum—1.0 weight % silicon—0.5 weight % copper is deposited by DC sputtering. As to the deposition conditions at this moment, argon is used as a process gas, pressure of the process gas is controlled at 3 mTorr, the deposition temperature at 100° C., and the deposition rate at 1 µm/min.

Next, as the high-temperature sputtering, a 100 nm thick aluminum alloy film 15 comprising aluminum—1.0 weight % silicon—0.5 weight % copper is deposited by DC sputtering. As to the deposition conditions at this moment, argon is used as a process gas, the process gas is controlled at a pressure of 3 mTorr, the deposition temperature at 300° C., and the deposition rate at 25 nm/min.

Finally, a 30 nm thick titanium film 16 is deposited by DC sputtering on the semiconductor device maintained at 50° C., followed by deposition of a 30 nm thick titanium nitride film 17 by reactive DC sputtering using nitrogen and argon, thereby obtaining a semiconductor device (FIG. 2) having a desired buried wiring connection hole.

A method for evaluating the semiconductor device having the buried wiring connection hole will be described. As in Embodiment 1, the semiconductor device is coated with a positive type resist 18, exposure and development are carried out according to conventional methods known in the art to form a wiring resist pattern. A relative two-dimensional coordinate accuracy between a registration accuracy measurement mark present in the resist pattern and the registration accuracy measurement mark already formed on the semiconductor device was optically measured. As a result, registration error in an optional xy direction was ±0.15 µm. Further, the wiring connection hole of the semiconductor device was observed by means of an optical excitation current measurement (OBIC) method and confirmed that no gap was present in the wiring connection hole. Therefore, the wiring connection hole is completely filled and is in the reliable state with sufficiently small registration error.

Embodiment 3

A still further embodiment will be shown. First, on the standard sample (FIG. 1), a 600 nm thick tungsten film 13 is deposited by a CVD method, which is full-face etched back to obtain a tungsten plug 19. After that, as an additional underlayer, a 30 nm thick titanium film is deposited by DC sputtering in the state maintained at 50° C.

Next, as the low-temperature sputtering, a 450 nm thick aluminum alloy film 14 comprising aluminum—1.0 weight % silicon—0.5 weight % copper is deposited by DC sputtering. As to the deposition conditions at this moment, argon is used as a process gas, the process gas is controlled at a pressure of 3 mTorr, the deposition temperature at 100° C., and the deposition rate at 1 µm/min.

Next, as the high-temperature sputtering, a 50 nm thick aluminum alloy film 15 comprising aluminum—1.0 weight % silicon—0.5 weight % copper is deposited by DC sputtering. As to the deposition conditions at this moment, argon is used as a process gas, the process gas is controlled at a pressure of 3 mTorr, the deposition temperature at 300° C., and the deposition rate at 25 nm/min.

Figure 3:
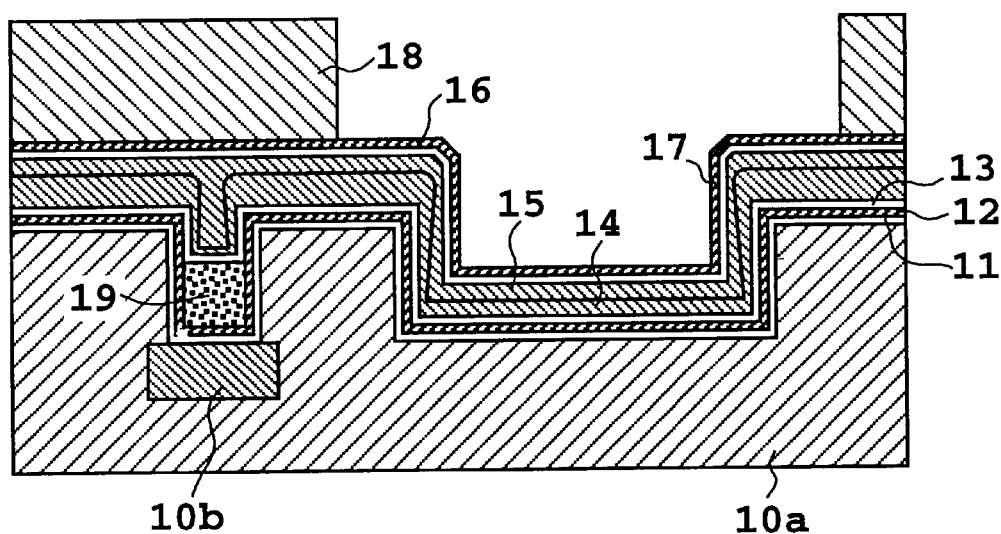
FIG. 3 is a sectional diagram showing a sectional structure of a wiring connection hole and a registration accuracy measurement mark of a semiconductor device on which aluminum material is formed according to the production method of the present invention.

Finally, a 30 nm thick titanium nitride film 16 is deposited by DC sputtering on the semiconductor device maintained at 50° C., followed by deposition of a 30 nm thick titanium nitride film 17 by reactive DC sputtering using nitrogen and argon, thereby obtaining a semiconductor device (FIG. 3) having a desired buried wiring connection hole.

A method for evaluating the semiconductor device having the buried wiring connection hole will be described. As in Embodiment 1, the semiconductor device is coated with a positive type resist 18, exposure and development are carried out according to conventional methods known in the art to form a wiring resist pattern. A relative two-dimensional coordinate accuracy between a registration accuracy measurement mark present in the resist pattern and the registration accuracy measurement mark already formed on the semiconductor device was optically measured. As a result, registration error in an optional xy direction was ±0.10 µm. Further, the wiring connection hole of the semiconductor device was observed by means of an optical excitation current measurement (OBIC) method and confirmed that no gap was present in the wiring connection hole. Therefore, the wiring connection hole is completely filled and is in the reliable state with sufficiently small registration error.

Further, the surface is observed by means of an interatomic force microscope (AFM), and confirmed to be flat.

Comparative Example 1

Comparative Example 1 is a case in which a film thickness A of the low-temperature sputtering aluminum previously deposited at 300° C. and a film thickness B of the high-temperature sputtering aluminum subsequently deposited at or above 300° C. are in a relation of A<B.

As in Embodiments 1 and 2, on the standard sample, first, as the low-temperature sputtering, a 200 nm thick aluminum alloy film 14 comprising aluminum—1.0 weight % silicon—0.5 weight % copper is deposited by DC sputtering. As to the deposition conditions at this moment, argon is used as a process gas, the process gas is controlled at a pressure of 3 mTorr, the deposition temperature at 100° C., and the deposition rate at 1 µm/min.

Next, as the high-temperature sputtering, a 300 nm thick aluminum alloy film 15 comprising aluminum—1.0 weight % silicon—0.5 weight % copper is deposited by DC sputtering. As to the deposition conditions at this moment, argon is used as a process gas, the process gas is controlled at a pressure of 3 mTorr, the deposition temperature at 400° C., and the deposition rate at 75 nm/min.

Finally, a 30 nm thick titanium film 16 is deposited by DC sputtering on the semiconductor device maintained at 50°

C., followed by deposition of a 30 nm thick titanium nitride film 17 by reactive DC sputtering using nitrogen and argon, thereby obtaining a semiconductor device having a desired buried wiring connection hole.

A method for evaluating the semiconductor device having the buried wiring connection hole will be described. As in Embodiments 1 and 2, the semiconductor device is coated with a positive type resist 18, exposure and development are carried out according to conventional methods known in the art to form a wiring resist pattern. A relative two-dimensional coordinate accuracy between a registration accuracy measurement mark present in the resist pattern and the registration accuracy measurement mark already formed on the semiconductor device was optically measured. As a result, registration error in an optional xy direction was ±0.27 μm. Further, the wiring connection hole of the semiconductor device was observed by means of an optical excitation current measurement (OBIC) method and confirmed that no gap was present in the wiring connection hole.

It can be seen from the above results that due to the condition of A<B the registration error is large as compared to Embodiments 1 and 2.

Comparative Example 2

Comparative Example 2 is a case in which the deposition rate of high-temperature sputtering deposited at above 300° C. is higher than 200 nm/min.

As in Embodiments 1 and 2, on the standard sample (FIG. 1), first, as the low-temperature sputtering, a 260 nm thick aluminum alloy film 14 comprising aluminum—1.0 weight % silicon—0.5 weight % copper is deposited by DC sputtering. As to the deposition conditions at this moment, argon is used as a process gas, the process gas is controlled at a pressure of 3 mTorr, the deposition temperature at 100° C., and the deposition rate at 1 μm/min.

Next, as the high-temperature sputtering, a 240 nm thick aluminum alloy film 15 comprising aluminum—1.0 weight % silicon—0.5 weight % copper is deposited by DC sputtering. As to the deposition conditions at this moment, argon is used as a process gas, the process gas is controlled at a pressure of 3 mtorr, the deposition temperature at 400° C., and the deposition rate at 400 nm/min.

Finally, a 30 nm thick titanium film 16 is deposited by DC sputtering on the semiconductor device maintained at 50° C., followed by deposition of a 30 nm thick titanium nitride film 17 by reactive DC sputtering using nitrogen and argon, thereby obtaining a semiconductor device having a desired buried wiring connection hole.

A method for evaluating the semiconductor device having the buried wiring connection hole will be described. As in Embodiments 1 and 2, the semiconductor device is coated with a positive type resist 18, exposure and development are carried out according to conventional methods known in the art to form a wiring resist pattern. A relative two-dimensional coordinate accuracy between a registration accuracy measurement mark present in the resist pattern and the registration accuracy measurement mark already formed on the semiconductor device was optically measured. As a result, registration error in an optional xy direction was ±0.20μm. Further, the wiring connection hole of the semiconductor device was observed by means of an optical excitation current measurement (OBIC) method and the presence of a gap was confirmed in the wiring connection hole.

Therefore, Comparative Example 2 is in the state of low reliability due to the fact that the wiring connection hole is not completely filled because the deposition rate of high-temperature sputtering is large.

UTILIZABILITY IN INDUSTRY

As described above, with the present invention, due to the conditions that the film thickness A of low-temperature sputtering and the film thickness B of high-temperature sputtering are in a relation of A>B, and the deposition rate of high-temperature sputtering is a rate which does not deteriorate the shape of the registration accuracy measurement mark, preferably 200 nm/min or less, the wiring connection hole can be completely filled in with aluminum or an aluminum alloy, thereby maintaining the shape of the registration accuracy measurement mark and reducing registration error. Therefore, the production method of a semiconductor device of the present invention can be advantageously applied particularly to formation of wiring of various semiconductor devices.

What is claimed is:

1. A production method of a semiconductor device for filling in a wiring connection hole by sputtering deposition of aluminum or an alloy mainly comprising aluminum characterized by a process for first depositing aluminum or an alloy mainly comprising aluminum at a temperature of below 300° C. (low-temperature sputtering), followed by a process for depositing aluminum or an alloy mainly comprising aluminum at or above 300° C. (high-temperature sputtering), wherein a thickness A of the film of aluminum or an alloy mainly comprising aluminum deposited at a temperature of below 300° C. and a thickness B of the film of aluminum or an alloy mainly comprising aluminum deposited at or above 300° C. are in a relation of A>B, and a deposition rate of aluminum or an alloy mainly comprising aluminum deposited at or above 300° C. is a rate which does not deteriorate the shape of a registration position measurement mark.

2. The production method of a semiconductor device as claimed in claim 1, wherein said deposition rate of aluminum or an aluminum alloy mainly comprising aluminum deposited at or above 300° C. is 200 nm/min or less.

3. The production method of a semiconductor device as claimed in claim 2, wherein said deposition rate is 40 nm/min to 100 nm/min.

4. The production method of a semiconductor device as claimed in claim 1, wherein said low-temperature sputtering is carried out at room temperature to 100° C.

5. The production method of a semiconductor device as claimed in claim 1, wherein said high-temperature sputtering is carried out at a temperature of 300° C. to 500° C.

6. The production method of a semiconductor device as claimed in claim 5, wherein said high-temperature sputtering is carried out at a temperature of 350° C. to 400° C.

7. The production method of a semiconductor device as claimed in claim 1, wherein said aluminum material is aluminum.

8. The production method of a semiconductor device as claimed in claim 1, wherein said aluminum material is an aluminum alloy.

9. The production method of a semiconductor device as claimed in claim 8, wherein said aluminum alloy is aluminum—1.0 weight % silicon—0.5 weight % copper.

10. The production method of a semiconductor device as claimed in claim 1, wherein said aluminum or aluminum alloy is deposited as a layer and is formed after forming an underlayer.

11. The production method of a semiconductor device as claimed in claim 10, wherein said underlayer is selected from the group consisting of a titanium film, a titanium nitride film, a titanium-tungsten alloy film, and a tungsten nitride film.

12. The production method of a semiconductor device as claimed in claim 10, wherein said underlayer comprises a laminate of titanium film, titanium nitride film and titanium film.

13. The production method of a semiconductor device as claimed in claim 1, wherein part of said wiring connection hole is buried with tungsten.

* * * * *